(12) United States Patent
Park (10) Patent No.: US 10,096,667 B2
(45) Date of Patent: Oct. 9, 2018

(54) DISPLAY DEVICE (71) Applicant: SAMSUNG DISPLAY CO., LTD., Yongin-si, Gyeonggi-Do (KR)

(72) Inventor: Sung Hyun Park, Seongnam-si (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 141 days.

(21) Appl. No.: 15/141,980

(22) Filed: Apr. 29, 2016

(65) Prior Publication Data

US 2016/0322451 A1 Nov. 3, 2016

(30) Foreign Application Priority Data

Apr. 29, 2015 (KR) .................. 10-2015-0060540

(51) Int. Cl.
- G06F 3/038 (2013.01)
- H01L 27/32 (2006.01)
- H01L 21/66 (2006.01)
- G09G 3/00 (2006.01)
- H01L 51/00 (2006.01)
- H01L 51/52 (2006.01)

(52) U.S. Cl.
CPC ......... H01L 27/3276 (2013.01); G09G 3/006 (2013.01); H01L 22/34 (2013.01); H01L 51/0031 (2013.01); G09G 2300/0413 (2013.01); G09G 2330/08 (2013.01); H01L 27/323 (2013.01); H01L 51/0097 (2013.01); H01L 51/5256 (2013.01)

(58) Field of Classification Search
USPC .......... 345/76, 84, 174, 204, 213, 214, 699; 324/757.01; 382/100; 315/129, 169.3
See application file for complete search history.

(56) References Cited

U.S. PATENT DOCUMENTS

| | | | | |
|---|---|---|---|---|
| 2002/0101173 A1* | 8/2002 | Tsai | .................. | G09G 3/298 315/169.3 |
| 2010/0103160 A1* | 4/2010 | Jeon | .................... | G09G 3/3233 345/213 |
| 2010/0134137 A1* | 6/2010 | Kida | .................... | G02F 1/1309 324/757.01 |

(Continued)

FOREIGN PATENT DOCUMENTS

| | | |
|---|---|---|
| JP | 2013-011663 | 1/2013 |
| JP | 2014-122974 | 7/2014 |
| KR | 1020080017732 | 2/2008 |

*Primary Examiner* — Thuy Pardo
(74) *Attorney, Agent, or Firm* — F. Chau & Associates, LLC (57) ABSTRACT

A display device includes a substrate including a display area and a non-display area disposed at a peripheral area of the display area. A plurality of pixels is disposed in the display area of the substrate. A plurality of signal lines is disposed on the substrate and is connected to the plurality of pixels. The plurality of signal lines include a plurality of gate lines and a plurality of data lines disposed on the substrate. A crack detecting line is disposed in the non-display area and is connected to a first data line of the plurality of data lines. The crack detecting line includes a first portion disposed below an insulating layer and a second portion disposed above the insulating layer. The first portion and the second portion are connected with each other through a contact hole formed in the insulating layer.

20 Claims, 5 Drawing Sheets

(56) References Cited

U.S. PATENT DOCUMENTS

| | | | | |
|---|---|---|---|---|
| 2010/0244705 A1* | 9/2010 | Hajjar | ............... | G09G 3/006 |
| | | | | 315/129 |
| 2013/0216089 A1* | 8/2013 | Chen | ............... | G06T 7/0002 |
| | | | | 382/100 |
| 2015/0379908 A1* | 12/2015 | Kim | ............... | G09G 3/006 |
| | | | | 345/84 |
| 2016/0103516 A1* | 4/2016 | An | ............... | H01L 51/5256 |
| | | | | 345/174 |
| 2016/0140896 A1* | 5/2016 | Kwon | ............... | G09G 3/3225 |
| | | | | 345/76 |

* cited by examiner

DISPLAY DEVICE

CROSS-REFERENCE TO RELATED APPLICATION

This application claims priority under 35 U.S.C. § 119 to Korean Patent Application No. 10-2015-0060540, filed on Apr. 29, 2015, in the Korean Intellectual Property Office, the disclosure of which is incorporated by reference herein in its entirety.

TECHNICAL FIELD

The present invention relates to a display device.

DISCUSSION OF THE RELATED ART

As portable display devices have been researched and developed, the display devices have changed from being flat shape to being flexible.

When cracks are generated in a manufacturing process of such flexible display devices, moisture may permeate into a display area of the display device. Moisture permeation into the display area due to the generated cracks may cause problems in the display device.

SUMMARY

According to an exemplary embodiment, a display device can detect generation of cracks in a display device.

According to an exemplary embodiment, a display device includes a substrate including a display area and a non-display area disposed at a peripheral area of the display area. A plurality of pixels disposed in the display area of the substrate, and a plurality of signal lines is disposed on the substrate and is connected to the plurality of pixels. The plurality of signal lines include a plurality of gate lines and a plurality of data lines disposed on the substrate, and a crack detecting line disposed in the non-display area and connected to a first data line of the plurality of data lines. The crack detecting line includes a first portion disposed below an insulating layer and a second portion disposed above the insulating layer. The first portion and the second portion are connected with each other through a contact hole formed in the insulating layer.

In an exemplary embodiment, the first portion of the crack detecting line is disposed on a first same layer as a gate line of the plurality of gate lines, and the second portion is disposed on a second same layer as a data line of the plurality of data lines.

In an exemplary embodiment, the plurality of signal lines further include a first test signal line and a second test signal line that are disposed in the non-display area, the crack detecting line is connected with the first data line through a first connection portion and a second connection portion, and the crack detecting line extends along an edge of the display area from the first connection portion to the second connection portion, and the plurality of data lines are connected to the first test signal line through a first switching element and connected to the second test signal line through a second switching element.

In an exemplary embodiment, the crack detecting line is connected to the first data line through the second switching element, and wherein the crack detecting line is connected to the second test signal line.

In an exemplary embodiment, the display device further includes a first test gate line disposed in the non-display area of the substrate and connected to the first switching element and a second test gate line disposed in the non-display area and connected to the second switching element, wherein, when a first gate-on voltage is applied to the first test gate line, the plurality of data lines receive a first test signal from the first test signal line, and when a second gate-on voltage is applied to the second test gate line, the plurality of data lines receive a second test signal from the second test signal line.

In an exemplary embodiment, the second gate-on voltage is applied after the first gate-on voltage is applied, and a first test voltage resulting from the first gate-on voltage is different from a second test voltage resulting from the second gate-on voltage.

In an exemplary embodiment, the plurality of signal lines further include a first test signal line and a second test signal line disposed in the non-display area of the substrate, the crack detecting line and the first data line are connected with each other through a first connection portion and a second connection portion, and the first crack detecting line extends along an edge of the display area from the first connection portion to the second connection portion, and the plurality of data lines are connected to the first test signal line through a first switching element, and connected to the second test signal line through a second switching element.

In an exemplary embodiment, the crack detecting line is connected to the first data line through the second switching element, and wherein the crack detecting line is connected to the second test signal line.

In an exemplary embodiment, the display device further includes a first test gate line connected to the first switching element and a second test gate line connected to the second switching element, wherein the first and second test gate lines are disposed in the non-display area of the substrate, wherein, when a first gate-on voltage is applied to the first test gate line, the plurality of data lines receive a first test signal from the first test signal line, and when a second gate-on voltage is applied to the second test gate line, the plurality of data lines receive a second test signal from the second test signal line.

In an exemplary embodiment, the second gate-on voltage is applied after the first gate-on voltage is applied, a first test voltage resulting from the first gate-on voltage is different from a second test voltage resulting from the second gate-on voltage According to an exemplary embodiment, a display device includes a substrate including a display area and a non-display area. The non-display area is disposed in an outer periphery of the display area. A pixel disposed in the display area. A first data line is connected to the pixel, and a crack detecting line is connected to the first data line. The crack detecting line includes an upper portion and a lower portion. The upper portion is disposed above an insulating layer of the substrate and the lower portion is disposed below the insulating layer of the substrate. The upper portion is connected to the lower portion through a contact hole that penetrates the insulating layer.

In an exemplary embodiment, the crack detecting line is disposed in the non-display area.

In an exemplary embodiment, the lower portion includes a first contact portion, the upper portion includes a second contact portion, wherein the first and second contact portions are connected with each other through the contact hole.

In an exemplary embodiment, the lower portion is disposed on a first same layer as a gate line, and the upper portion is disposed on a second same layer as the first data line.

In an exemplary embodiment, the lower portion is disposed on a first same layer as a gate electrode of a thin film transistor, and the upper portion is disposed on a second same layer as a drain electrode.

In an exemplary embodiment, the display device further includes a second switching element connected to the first data line and a second test signal line, wherein the crack detecting line is connected to the second switching element and to the second test signal line.

In an exemplary embodiment, the display device further includes a first test signal line connected to the first data line through a first switching element, a first test gate line connected to the first switching element, and a second test gate line connected to the second switching element, wherein, when a first gate-on voltage is applied to the first test gate line, the first data line receives a first test signal from the first test signal line, and when a second gate-on voltage is applied to the second test gate line, the first data line receives a second test signal from the second test signal line.

In an exemplary embodiment, when the second gate-on voltage is applied after the first gate-on voltage is applied, a first test voltage resulting from the first gate-on voltage is different from a second test voltage resulting from the second gate-on voltage.

According to an exemplary embodiment, a display device includes a substrate including a display area and a non-display area disposed in an outer periphery of the display area. A pixel is disposed in the display area. A first data line is connected to the pixel, and a crack detecting line is connected to the first data line and disposed in the non-display area. The crack detecting line comprises a first portion disposed above an insulating layer, and a second portion disposed below the insulating layer. The insulating layer is disposed on the substrate. The first portion is connected to the second portion in a hole that penetrates the insulating layer.

In an exemplary embodiment, the second portion is disposed on a first same layer as a gate electrode of a thin film transistor, and the first portion is disposed on a second same layer as a drain electrode.

DETAILED DESCRIPTION OF THE EMBODIMENTS

The present invention will be described more fully hereinafter with reference to the accompanying drawings, in which exemplary embodiments of the present invention are shown. The disclosed exemplary embodiments may be modified in various different ways without departing from the spirit and scope of the present invention.

In the drawings, the thicknesses of layers, films, panels, regions, etc., may be exaggerated for clarity. Like reference numerals may refer to like elements throughout the specification. When an element such as a layer, film, region, or substrate is referred to as being "on" another element, it may be directly on the other element or intervening elements may be present.

Figure 1:
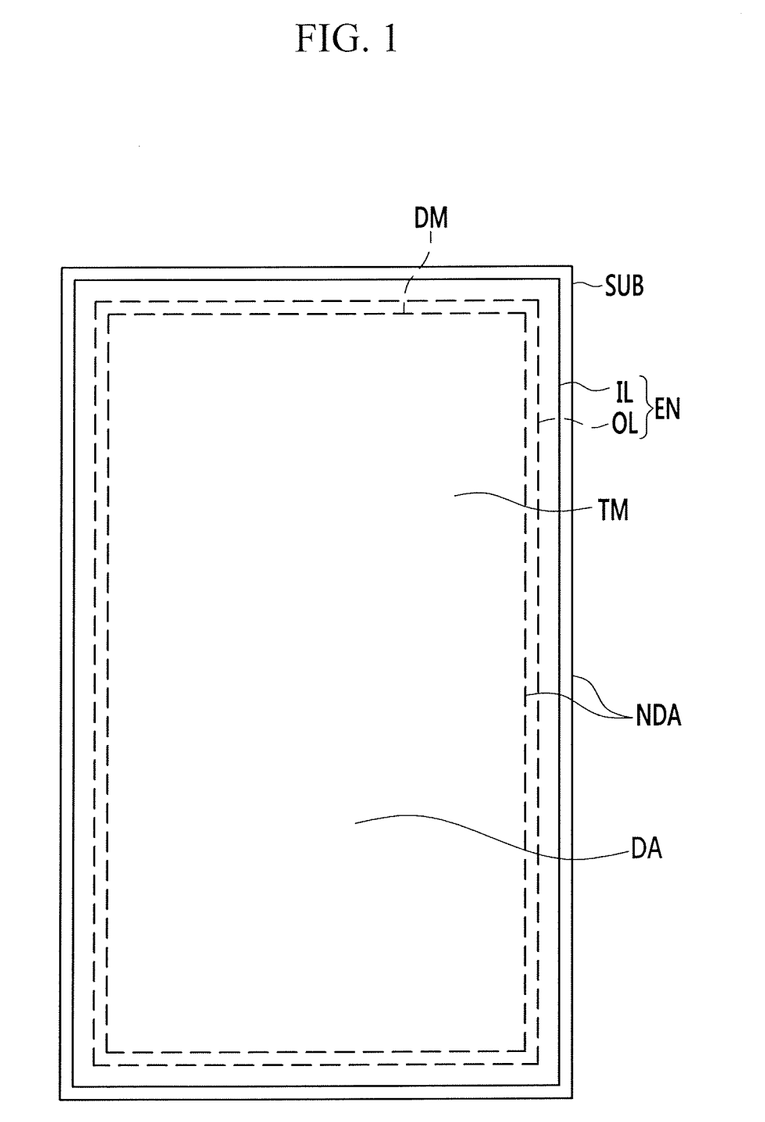
FIG. 1 illustrates a top plan view of a display device, according to an exemplary embodiment.

Referring to FIG. 1, a display device will be described according to an exemplary embodiment. FIG. 1 illustrates a top plan view of a display device, according to an exemplary embodiment.

Referring to FIG. 1, a display device, according to an exemplary embodiment, includes a substrate SUB, a display portion DM, an encapsulation portion EN, and a touch portion TM.

The substrate SUB is an insulating substrate including glass, a polymer, or stainless steel. The substrate SUB may be flexible, stretchable, foldable, bendable, or rollable. For example, the substrate SUB may be formed as a flexible film including a resin such as a polyimide. Since the substrate SUB is flexible, stretchable, foldable, bendable, or rollable, the entire display device may be flexible, stretchable, foldable, bendable, or rollable.

The substrate SUB includes a display area DA displaying an image and a non-display area NDA disposed at a peripheral area of the display area DA. The display area DA may correspond to the display portion DM. In an exemplary embodiment, the non-display area NDA surrounds the display area DA at an outer periphery of the display area DA. In an exemplary embodiment, the non-display area NDA may be disposed at lateral sides of the display area DA.

The display area DA of the substrate SUB includes a plurality of pixels. A pixel is an image displaying unit.

The encapsulation portion EN is disposed on the substrate SUB throughout the display area DA and the non-display area NDA, and encapsulates the plurality of pixels of the display area DA together with the substrate SUB. The encapsulation portion EN may be formed as a thin film encapsulation portion. The encapsulation portion EN includes an organic layer OL disposed on the display portion DM and an inorganic layer IL disposed on the organic layer OL. The encapsulation portion EN, according to an exemplary embodiment, may include one or more organic layers OL and one or more inorganic layers IL that are alternately layered. Thus, the inorganic layer IL and the organic layer OL may be provided in plural, and the plurality of inorganic layers IL and the plurality of organic layers OL may be respectively disposed on the display portion DM in an alternating fashion. The alternating fashion in which the plurality of organic layer OL and inorganic layers IL are disposed may include a first organic layer OL disposed on the display portion DM, a first inorganic layer IL disposed on the first organic layer OL, a second organic layer OL disposed on the first inorganic layer IL, and the like. In an exemplary embodiment, the encapsulation portion EN may include at least one sandwich structure in which at least one organic layer OL is inserted between at least two inorganic layers IL.

Figure 2:
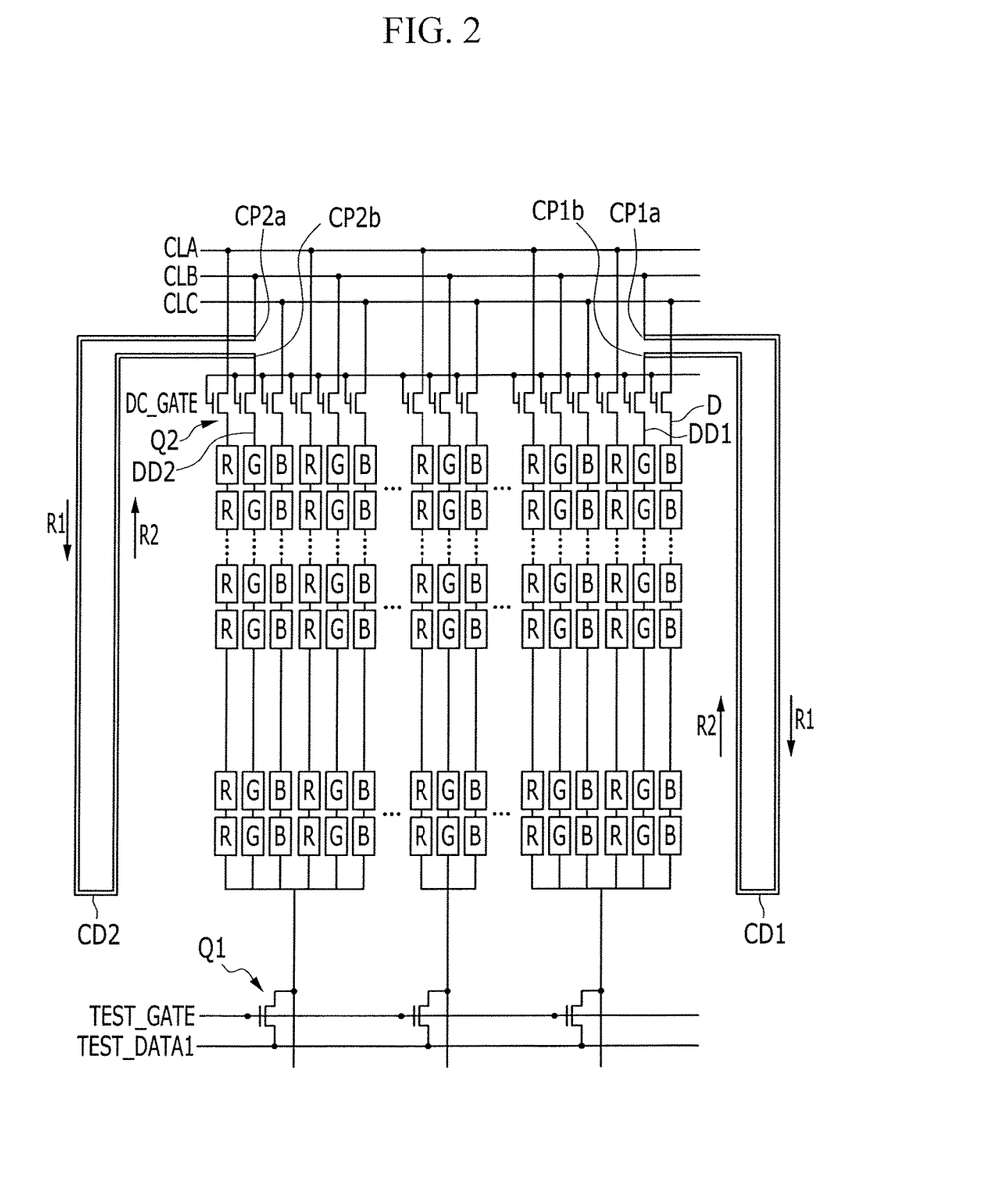
FIG. 2 illustrates a layout view of a display device, according to an exemplary embodiment.

Referring to FIGS. 1 and 2, an arrangement of elements of a display device will be described, according to an exemplary embodiment. FIG. 2 illustrates a layout view of a display device, according to the exemplary embodiment.

Referring to FIGS. 1 and 2, a display device, according to an exemplary embodiment, includes a display area DA where a plurality of pixels R, G, and B are formed and a non-display area NDA disposed at an outer periphery of the display area DA.

The display device, according to an exemplary embodiment, includes the plurality of pixels R, G, and B formed on the substrate SUB and a plurality of signal lines connected to the plurality of pixels R, G, and B. The plurality of pixels R, G, and B are formed in the display area DA of the substrate SUB and a part of the plurality of signal lines is formed in the non-display area NDA.

The plurality of signal lines include a first test gate line TEST_GATE, a second test gate line DC_GATE, a plurality of data lines D, a first test signal line TEST_DATA1, a plurality of second test signal lines CLA, CLB, and CLC, a first crack detecting line CD1, and a second crack detecting line CD2.

The display device includes a plurality of first switching element Q1 connected to the first test gate line TEST_GATE, the first test signal line TEST_DATA1, and the plurality of data lines D. A plurality of second switching elements Q2 is connected to the second test gate line DC_GATE, the plurality of second test signal lines CLA, CLB, and CLC, and the plurality of data lines D.

Among the plurality of data lines D, a first data line DD1 is connected with the first crack detecting line CD1. A second data line DD2 is connected with the second crack detecting line CD2.

The first crack detecting line CD1 and the second crack detecting line CD2 are disposed at lateral sides of the plurality of pixels R, G, and B.

The first crack detecting line CD1 and the second crack detecting line CD2 are formed in the non-display area NDA that is adjacent to lateral edges of the display area DA where the plurality of pixels R, G, and B are formed. For example, the first crack detecting line CD1 and the second crack detecting line CD2 are disposed in the non-display area NDA that is adjacent to the display area DA where the plurality of pixels R, G, and B are formed. The first and second crack detecting lines CD1 and CD2 are disposed at lateral sides of the display area DA.

The first crack detecting line CD1 is connected to the first data line DD1 through a first connection portion CP1$a$ and a second connection portion CP1$b$. The first crack detecting line CD1 is connected to both the first connection portion CP1$a$ and the second connection portion CP1$b$. The first crack detecting line CD1 is extended in a first direction R1 along the peripheral area that is adjacent to the edge of the display area DA from the first connection portion CP1$a$, and then extended in a second direction R2 which is opposite to the first direction R1 such that the first crack detecting line CD1 is connected with the first data line DD1 through the second connection portion CP1$b$. Similarly, the second crack detecting line CD2 is connected to the second data line DD2 through a third connection portion CP2$a$ and a fourth connection portion CP2$b$. The second crack detecting line CD2 is connected to both the third connection portion CP2$a$ and the fourth connection portion CP2$b$. The second crack detecting line CD2 is extended in the first direction R1 along the peripheral area that is adjacent to the edge of the display area DA from the third connection portion CP2$a$, and then extended in the second direction R2 which is opposite to the first direction R1 such that the second crack detecting line CD2 is connected with the second data line DD2 through the fourth connection portion CP2$b$. The first and second crack detecting lines CD1 and CD2 may be disposed in the non-display area NDA, along opposite sides of the display area DA.

As described, the first crack detecting line CD1 and the second crack detecting line CD2 are formed in the non-display area NDA, adjacent to lateral edges of the display area DA.

The first crack detecting line CD1 is connected to one of the plurality of second test signal lines CLA, CLB, and CLC through the first connection portion CP1$a$. For example, the first crack detecting line CD1 is connected to the second test signal line CLB through the first connection portion CP1$a$. Then, the first crack detecting line CD1 connects to a second switching element Q2 of the plurality of switching elements Q2 through the second connection portion CP1$b$. The first crack detecting line CD1 connects to the switching element Q2 that is connected to the first data line DD1. The first data line DD1 connects to the first test signal line TEST_DATA1 through a first switching element Q1 of the plurality of first switching elements Q1.

The second crack detecting line CD2 is connected to one of the plurality of second test signal lines CLA, CLB, and CLC through the third connection portion CP2$a$. For example, the second crack detecting line CD2 is connected to the second test signal line CLB through the third connection portion CP2$a$. Then, the second crack detecting line CD2 connects to a second switching element Q2 (e.g., a different second switching element Q2 than the one that the first crack detecting line CD1 is connected to) of the plurality of switching elements Q2 through the fourth connection portion CP2$b$. The second crack detecting line CD2 connects to the switching element Q2 that is connected to the second data line DD2. The second data line DD2 connects to the first test signal line TEST_DATA1 through a first switching element Q1 of the plurality of first switching elements Q1 (e.g., a different first switching element Q1 than the one that the first data line DD1 is connected to).

Each of the first and second crack detecting lines CD1 and CD2 may be disposed above and below an insulating layer of the substrate SUB. For example, a portion of the first crack detecting line CD1 that extends along the first direction R1 may be disposed above the insulating layer. A portion of the first crack detecting line CD1 that extends along the second direction R2 may be disposed below the insulating layer. Similarly, a portion of the second crack detecting line CD2 that extends along the first direction R1 may be disposed above the insulating layer and a portion of the second crack detecting line CD2 that extends along the second direction R2 may be disposed below the insulating layer. Accordingly, the first and second crack detecting lines CD1 and CD2 may be formed, for example, in the shape of a hemi-ring in which patterns of each of the crack detecting lines CD1 and CD2 extend substantially parallel to each other along an edge of the display area DA. For example, the first and second crack detecting lines CD1 and CD2 may be formed in an L-shape.

The first crack detecting line CD1 and the second crack detecting line CD2 are formed in the same layer that the signal lines (e.g., gate wires and data wires) are formed on, and in the same layer that the plurality of pixels R, G, and B of the display area DA are formed on.

Figure 3:
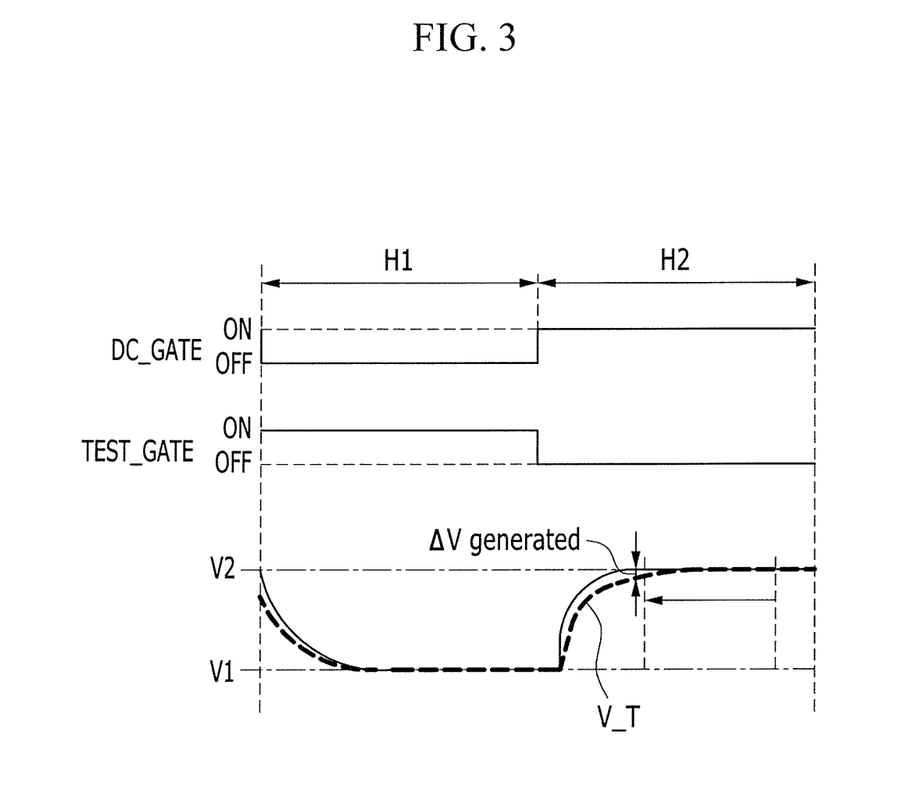
FIG. 3 illustrates a waveform diagram of a signal of a display device, according to an exemplary embodiment.

Referring to FIG. 3, an operation of a display device will be described according to an exemplary embodiment. FIG. 3 illustrates a waveform diagram of a signal of a display device, according to an exemplary embodiment.

Referring to FIG. 3, when a gate-on signal ON is applied to the first test gate line TEST_GATE, the plurality of second switching elements Q2 connected to the plurality of data lines D are turned on. Thus, a first signal V1 applied to the first test signal line TEST_DATA1 is applied to the plurality of data lines D. The plurality of pixels R, G, and B display a white color by the first signal V1.

When the first signal V1 is applied to the plurality of data lines D, the plurality of pixels R, G, and B display a white color.

When the gate-on signal ON is applied to the second test gate line DC_GATE after a gate-off signal OFF is applied to the first test gate line TEST_GATE, the second switching elements Q2 connected to the plurality of data lines D is turned on and thus a second signal V2 applied to the plurality of second test signal lines CLA, CLB, and CLC is applied to the plurality of data lines D. The plurality of pixels R, G, and B display a black color by the second signal V2.

When the second signal V2 is applied to the plurality of data lines D, the plurality of pixels R, G, and B display a black color.

When cracks are generated in the non-display area NDA disposed at the peripheral area of the display area DA, the first crack detecting line CD1 and the second crack detecting line CD2 may be damaged.

When the first crack detecting line CD1 and the second crack detecting line CD2 are damaged, resistances of the first and second data lines DD1 and DD2 connected to the first and second crack detecting lines CD1 and CD2 are increased. Thus a voltage V_T applied to pixels connected to the first and second data lines DD1 and DD2 cannot be charged to the second signal V2, thereby generating a voltage difference ΔV with the second signal V2.

Since the voltage difference ΔV is generated, pixels connected to the first and second data lines DD1 and DD2 do not display a black color and thus display bright light. Due to the generation of such bright light, occurrence of cracks in the peripheral area that is adjacent to the edges of the display area can be detected.

Figure 4:
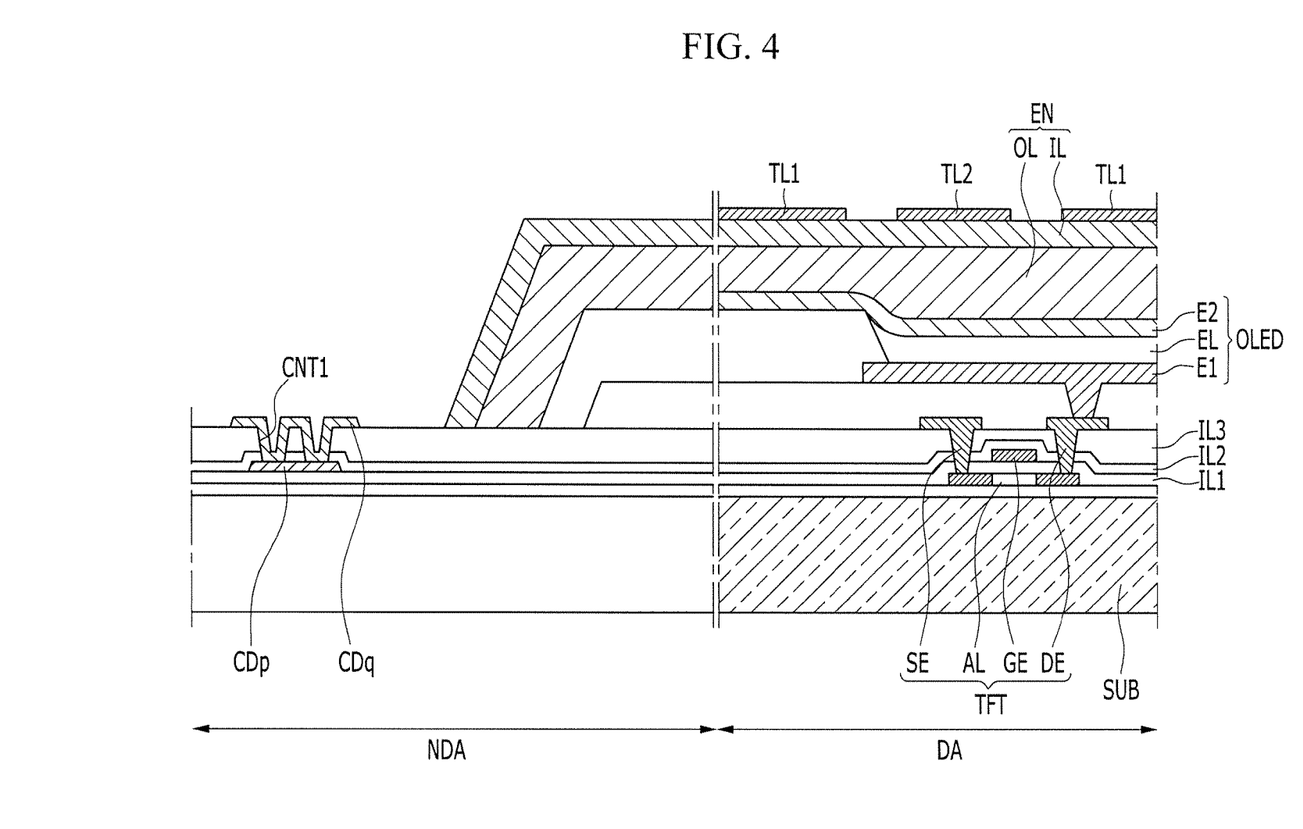
FIG. 4 illustrates a cross-sectional view of a part of a display device, according to an exemplary embodiment.

An interlayer structure of the display device will be described with reference to FIGS. 1, 2, and 4, according to an exemplary embodiment. FIG. 4 is a cross-sectional view of a part of a display device, according to an exemplary embodiment.

Referring to FIGS. 1, 2, and 4, each pixel of the display area DA includes an organic light emitting diode OLED emitting light and a thin film transistor TFT connected with the organic light emitting element OLED.

The thin film transistor TFT includes an active layer AL, a gate electrode GE, a source electrode SE, and a drain electrode DE.

The active layer AL may be formed of a polysilicon or an oxide semiconductor. The oxide semiconductor may include titanium (Ti), hafnium (Hf), zirconium (Zr), aluminum (Al), tantalum (Ta), germanium (Ge), zinc (Zn), gallium (Ga), tin (Sn), indium (In), zinc oxide (ZnO), indium-gallium-zinc oxide (InGaZnO4), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), or hafnium-indium-zinc oxide (Hf—In—Zn—O), which are complex oxides thereof.

The active layer AL includes a channel area in which impurities are not doped, a source area, and a drain area. Here, the source area and the drain area are doped with impurities and are disposed at lateral sides of the channel area, respectively. The impurities vary according to a kind of thin film transistor, and may be N-type impurities or P-type impurities. In the case where the active layer AL is formed of the oxide semiconductor, a separate passivation layer may be added to protect the oxide semiconductor which is vulnerable to high temperature and other external environment conditions.

The gate electrode GE is disposed on the active layer AL. A first insulating layer IL1 may be disposed between the gate electrode GE and the active layer AL. The source electrode SE is disposed on a second insulating layer IL2 and on a third insulating layer IL3. The drain electrode DE is disposed on the second insulating layer IL2 and on the third insulating layer IL3. The second insulating layer IL2 and the third insulating layer IL3 cover the gate electrode GE. The source electrode SE is connected with the source area of the active area AL through a contact hole formed in the second and third insulating layers IL2 and IL3. The drain electrode DE is connected with the drain area of the active area AL through a contact hole formed in the second and third insulating layers IL2 and IL3. The drain electrode DE is connected with a first electrode E1 of the organic light emitting diode OLED through a contact hole.

The organic light emitting diode OLED includes a first electrode E1 connected with the drain electrode DE of the thin film transistor TFT, an organic emission layer EL disposed on the first electrode E1, and a second electrode E2 disposed on the organic emission layer EL.

The first electrode E1 may be an anode, which is a hole injection electrode. The first electrode E1 may be a light reflective electrode, a light transmissive electrode, or a light transflective electrode. In an exemplary embodiment, the first electrode E1 may be a cathode, which is an electron injection electrode.

The organic emission layer EL is disposed on the first electrode E1. The organic emission layer EL may be formed of a low-molecular organic material or a high-molecular organic material such as poly (3,4-ethylenedioxythiophene) (PEDOT). The organic emission layer EL may include a red organic emission layer emitting red light, a green organic emission layer emitting green light, and a blue organic emission layer emitting blue light. The red organic emission layer, the green organic emission layer, and the blue organic emission layer are formed in a red pixel R, a green pixel G, and a blue pixel B, respectively, to produce a color image. The red organic emission layer is laminated on the red pixel R. The green organic emission layer is laminated on the green pixel G. The blue organic emission layer is laminated on the blue pixel B. A red color filter, a green color filter, and a blue color filter may be formed for each red pixel R, green pixel G, and blue pixel B, respectively, to produce a color image. In an exemplary embodiment, white organic emission layers emitting white light are formed in all of the red pixel R, the green pixel G, and the blue pixel B. A red color filter, a green color filter, and a blue color filter are formed for each red pixel R, green pixel G, and blue pixel B, respectively, to produce the color image. In the case of producing the color image by using the white organic emission layer as the organic emission layer EL and the color filters, a deposition mask for depositing the red organic emission layer, the green organic emission layer, and the blue organic emission layer on respective pixels, (e.g., the red pixel R, the green pixel G, and the blue pixel B) need not be used. In an exemplary embodiment, the white organic emission layer may be formed by one organic emission layer, and includes a configuration formed to emit white light by laminating a plurality of organic emission layers. For example, the white organic emission layer may include a configuration which may emit white light by combining at least one yellow organic emission layer and at least one blue light emitting layer, a configuration which may emit white light by combining at least one cyan organic emission layer and at least one red light emitting layer, a configuration which may emit white light by combining at least one magenta organic emission layer and at least one green light emitting layer, and the like.

The second electrode E2 is disposed on the organic emission layer EL, and may be a cathode, which is an electron injection electrode. The second electrode E2 may be a light reflective electrode, a light transmissive electrode, or a light transflective electrode. The second electrode E2 is disposed throughout the display area DA of the substrate SUB to cover the organic emission layer EL. In an exemplary embodiment, the second electrode E2 may be an anode, which is a hole injection electrode.

The encapsulation portion EN is disposed on the substrate SUB through the display area DA and the non-display area NDA, and encapsulates the display portion DM together with the substrate SUB. The encapsulation portion EN includes an organic layer OL disposed on the display area DA and an inorganic layer IL disposed on the organic layer OL.

The organic layer OL is made of a polymer, and may be a single layer or a structure that includes stacked layers formed of for example, polyethylene terephthalate, a polyimide, a polycarbonate, an epoxy, a polyethylene, or a polyacrylate. For example, the organic layer OL may be formed of polyacrylate, and may include a material produced by polymerizing a monomer component including a diacrylate-based monomer and a triacrylate-based monomer. Here, a monoacrylate-based monomer may be further included in the monomer component. A photoinitiator such as, for example, TPO, may be further included in the monomer component. However, the present invention is not limited thereto.

The inorganic layer IL may be a monolayer or a multilayer containing a metal oxide or a metal nitride. The inorganic layer IL may contain SiNx, $Al_2O_3$, $SiO_2$, or $TiO_2$.

The inorganic layer IL, which is the uppermost layer of the encapsulation portion EN, is disposed over an area greater than that on which the organic layer OL is disposed to cover ends of the organic layer OL. The inorganic layer IL covers the ends of the organic layer OL in the non-display area NDA of the substrate SUB. An uppermost inorganic layer IL of the encapsulation portion EN may be disposed on an area greater than those of the other organic layers OL and/or inorganic layers IL disposed underneath it to cover the ends of the other organic layers OL and/or inorganic layers IL disposed underneath it. Accordingly, external moisture permeation into the organic light emitting diode OLED can be suppressed by the inorganic layer IL.

The touch portion TM includes a first touch line TL1 and a second touch line TL2 disposed on the encapsulation portion EN corresponding to the display area DA of the substrate SUB. When the touch portion TM is touched, voltages are applied to the first touch line TL1 and the second touch line TL2, respectively. The touch portion TM may be a capacitive type. Thus, voltages applied to the first touch line TL1 and the second touch line TL2, or between the first and second touch lines TL1 and TL2 are charged in each of the first and second touch lines TL1 and TL2. Accordingly, the capacitance of the touch portion TM is changed, and a location of the touch portion TM that was touched can be detected by identifying the first touch line TL1 and/or second touch line TL2 of which the capacitance changed. The touch portion TM may further include one or more insulating layers covering the first touch line TL1 and the second touch line TL2. Each of the first touch line TL1 and the second touch line TL2 may include one or more of a transparent conductive material such as indium tin oxide (ITO), indium zinc oxide (IZO), indium gallium zinc oxide (IGZO), and the like, a metal mesh patterned in a mesh form, a conductive polymer such as PEDOT, and the like, a nano-sized conductive material such as a silver nanowire (AGNW), and the like.

The first crack detecting line CD1 and the second crack detecting line CD2 are formed in the non-display area NDA where the encapsulation portion EN is not formed.

Each of the first crack detecting line CD1 and the second crack detecting line CD2 include a first portion CDp formed on the same layer as the gate electrode GE formed in the display area DA, and a second portion CDq formed on the same layer as the source electrode SE and the drain electrode DE formed in the display area DA. The first portion CDp and the second portion CDq are connected with each other through a first contact hole CNT1 formed in the second and third insulating layers IL2 and IL3. The second and third insulating layers IL2 and IL3 are disposed between the gate electrode GE, and the source electrode SE and the drain electrode DE.

When cracks are generated in the non-display area NDA, cracks are generated in the second and third insulating layers IL2 and IL3. When the cracks are generated in the second and third insulating layers IL2 and IL3, the first contact hole CNT1 where the first portion CDp and the second portion CDq are connected may be damaged such that the first portion CDp and the second portion CDq of the first crack detecting line CD1 and the second crack detecting line CD2 may be disconnected. When the first portion CDp and the second portion CDq are disconnected, a crack detection signal is no longer transmitted. Accordingly generation of cracks can be determined.

Generation of cracks may be difficult to detect when cracks are generated in the second insulating layer IL2 and the third insulating layer IL3 and the first crack detecting line CD1 and the second crack detecting line CD2 are not damaged in a case that each of the first crack detecting line CD1 and the second crack detecting line CD2 are formed only on the same layer as the gate electrode GE or only the same layer as the source electrode SE and the drain electrode DE (e.g., when each of the first and second crack detecting lines CD1 and CD2 do not have a first portion formed above a layer and a second portion formed below the layer, but are formed entirely either above or below the layer).

However, in a display device according to an exemplary embodiment, each of the first crack detecting line CD1 and the second crack detecting line CD2 include the first portion CDp and the second portion CDq disposed above and below the second insulating layer IL2 and the third insulating layer IL3, interposing the second insulating layer IL2 and the third insulating layer IL3 therebetween. The first portion CDp and the second portion CDq are connected with each other through the first contact hole CNT1 formed in the second and third insulating layers IL2 and IL3. Thus, when cracks are generated only in the insulating layers IL2 and IL3 and no cracks are generated in the first crack detecting line CD1 and the second crack detecting line CD2, the cracks can be detected.

As described above, in a display device, according to an exemplary embodiment, cracks can be detected not only when the first and second crack detecting lines CD1 and CD2 are damaged by the cracks (e.g., the portions of the first and second crack detecting lines that extend along the first direction R1 and the second direction R2), but also when the cracks are generated only in the insulating layers disposed above and below the first and second crack detecting lines CD1 and CD2 (e.g., the second and third insulating layer IL2 and IL3) without damaging the crack detecting lines CD1 and CD2. When cracks develop in insulating layers such as the first and second insulating layers IL2 and IL3, they can be detected by a loss of a crack detection signal transmitted between the first portion CDp and the second portion CDq through the first contact hole CNT1 (e.g., when the electrical connection between the first portion CDp and the second portion CDq is lost due to movement of the first portion CDp and the second portion CDq caused by the cracks).

Figure 5:
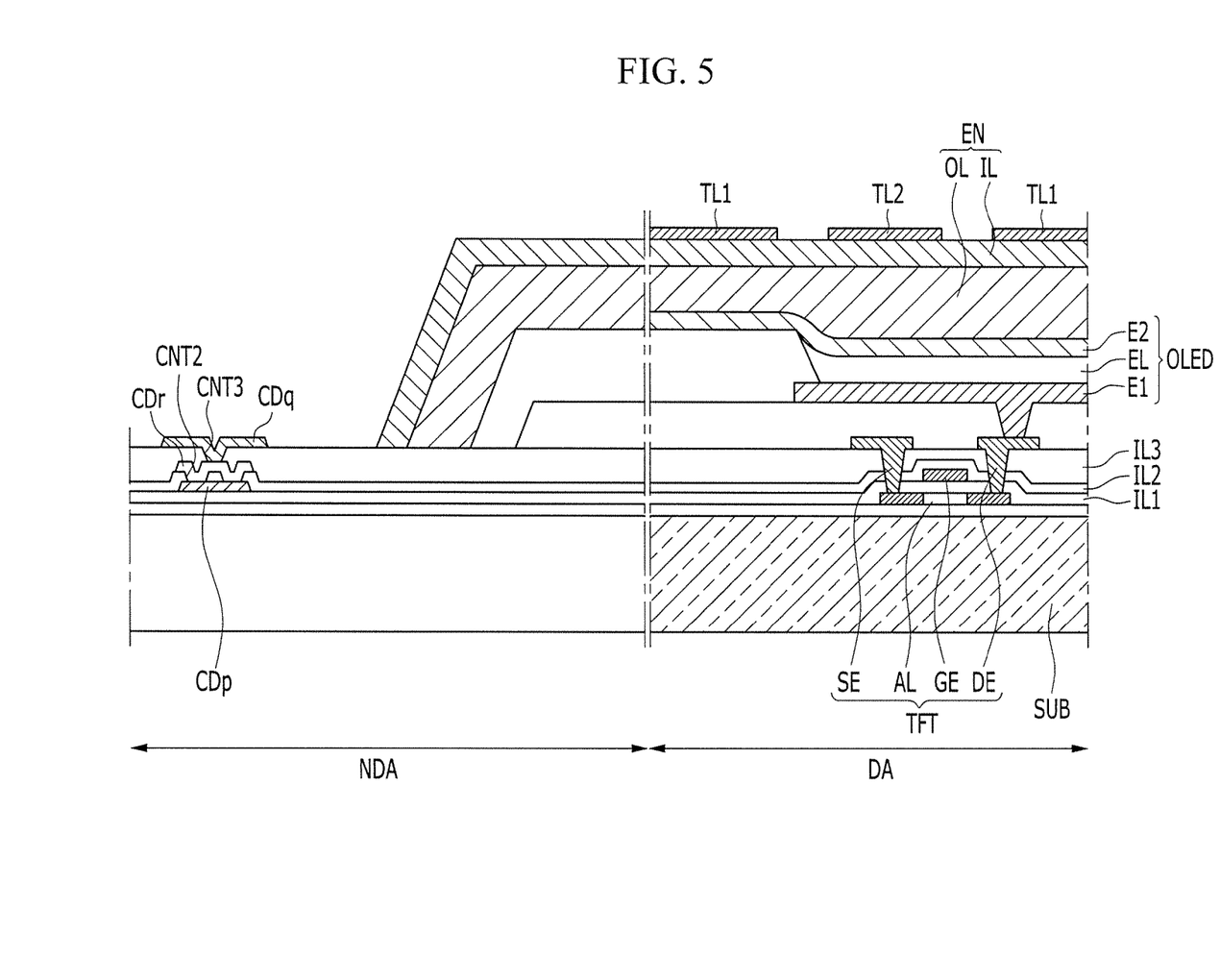
FIG. 5 illustrates a cross-sectional view of a part of a display device, according to an exemplary embodiment.

Referring to FIGS. 1, 2, and 5, an interlayer structure of a display device will be described according to an exemplary embodiment. FIG. 5 is a cross-sectional view illustrating a part of a display device, according to an exemplary embodiment.

Referring to FIGS. 1, 2, and 5, each pixel in the display area DA includes an organic light emitting diode OLED emitting light and a thin film transistor TFT connected with the organic light emitting diode OLED.

The thin film transistor TFT includes an active layer AL, a gate electrode GE, a source electrode SE, and a drain electrode DE.

The gate electrode GE is disposed on the active layer AL. A first insulating layer IL1 may be disposed between the gate electrode GE and the active layer AL. The source electrode SE is disposed on a second insulating layer IL2 and on a third insulating layer IL3. The drain electrode DE is disposed on the second insulating layer IL2 and on the third insulating layer IL3. The second insulating layer IL2 and the third insulating layer IL3 cover the gate electrode GE. The source electrode SE is connected with the source area of the active area AL through a contact hole formed in the second and third insulating layers IL2 and IL3. The drain electrode DE is connected with the drain area of the active area AL through a contact hole formed in the second and third insulating layers IL2 and IL3. The drain electrode DE is connected with a first electrode E1 of the organic light emitting diode OLED through a contact hole. A gate wire is additionally disposed between the second insulating layer IL2 and the third insulating layer IL3.

The organic light emitting diode OLED includes a first electrode E1 connected with the drain electrode DE of the thin film transistor TFT, an organic emission layer EL disposed on the first electrode E1, and a second electrode E2 disposed on the organic emission layer EL.

An encapsulation portion EN is disposed on the substrate SUB throughout a display area DA and a non-display area NDA, and encapsulates the plurality of pixels of the display area DA together with the substrate SUB. The encapsulation portion EN includes an organic layer OL disposed on the display portion DM and an inorganic layer IL disposed on the organic layer OL.

A touch portion TM includes a first touch line TL1 and a second touch line TLs disposed on the encapsulation portion EN corresponding to the display area DA of the substrate SUB.

The first crack detecting line CD1 and the second crack detecting line CD2 are formed in the non-display area NDA where the encapsulation portion EN is not formed.

Each of the first crack detecting line CD1 and the second crack detecting line CD2 include a first portion CDp formed on the same layer as the gate electrode GE formed in the display area DA, a second portion CDq formed on the same layer as the source electrode SE and the drain electrode DE formed in the display area DA, and a third portion CDr formed in the same layer as the additional gate wire formed between the second insulating layer IL2 and the third insulating layer IL3.

The first portion CDp and the third portion CDr are connected with each other through a second contact hole CNT2 formed in the second insulating layer IL2. The third portion CDr and the second portion CDq are connected with each other through a third contact hole CNT3 formed in the third insulating layer IL3.

When cracks are generated in the non-display area NDA, cracks are generated in the second and third insulating layers IL2 and IL3. As described, when the cracks are generated in the second insulating layer IL2 and the third insulating layer IL3, the second contact hole CNT2 through which the first portion CDp and the third portion CDr are connected, and the third contact hole CNT3 through which the third portion CDr and the second portion CDq are connected, may be damaged so that the first portion CDp and the second portion CDq of the first and second crack detecting lines CD1 and CD2 may be disconnected. As described, when the first portion CDp and the third portion CDr are disconnected, or the third portion CDr and the second portion CDq are disconnected, a crack detection signal is no longer transmitted. Thus, generation of cracks can be detected.

Generation of cracks may be difficult to detect when cracks are generated in the second insulating layer IL2 and the third insulating layer IL3 and the first crack detecting line CD1 and the second crack detecting line CD2 are not damaged because the first crack detecting line CD1 and the second crack detecting line CD2 are formed only on the same layer as the gate electrode GE or only the same layer as the source electrode SE and the drain electrode DE.

However, in a display device according to an exemplary embodiment, each of the first crack detecting line CD1 and the second crack detecting line CD2 include the first portion CDp, the second portion CDq, and the third portion CDr disposed above and below the second insulating layer IL2 and the third insulating layer IL3, interposing the second insulating layer IL2 and the third insulating layer IL3 therebetween. The first portion CDp, the second portion CDq, and the third portion CDr are connected with each other through the second contact hole CNT2 and the third contact hole CNT3 formed in the second and third insulating layers IL2 and IL3. Thus, when cracks are generated only in the insulating layers IL2 and IL3 and no cracks are generated in the first crack detecting line CD1 and the second crack detecting line CD2, the cracks can be detected.

As described above, in a display device, according to an exemplary embodiment, cracks can be detected not only when the first and second crack detecting lines CD1 and CD2 are damaged by the cracks, but also when the cracks are generated only in the insulating layers disposed above and below the first and second crack detecting lines CD1 and CD2 (e.g., the second and third insulating layer IL2 and IL3) without damaging the crack detecting lines CD1 and CD2. When cracks develop in insulating layers such as the first and second insulating layers IL2 and IL3, they can be detected by a loss of a crack detection signal transmitted between the first portion CDp and the third portion CDr through the second contact hole CNT2, between the third portion CDr and the second portion CDq through the third contact hole CNT3, or between the first portion CDp and the second portion CDq.

In the aforementioned exemplary embodiments, the display device includes the encapsulation portion EN. However, the present invention is not limited thereto. For example, in an exemplary embodiment, the encapsulation portion EN may be omitted.

While the inventive concept has been particularly shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A display device comprising:
a substrate including a display area and a non-display area disposed at a peripheral area of the display area;
a plurality of pixels disposed in the display area of the substrate; and
a plurality of signal lines disposed on the substrate and connected to the plurality of pixels,
wherein the plurality of signal lines comprise:
a plurality of gate lines and a plurality of data lines disposed on the substrate; and
a crack detecting line disposed in the non-display area and connected to a first data line of the plurality of data lines,
wherein the crack detecting line includes a first portion disposed below an insulating layer and a second portion disposed above the insulating layer, and
the first portion and the second portion are connected with each other through a contact hole formed in the insulating layer.

2. The display device of claim 1, wherein the first portion of the crack detecting line is disposed on a first same layer as a gate line of the plurality of gate lines, and the second portion is disposed on a second same layer as a data line of the plurality of data lines.

3. The display device of claim 2, wherein the plurality of signal lines further comprise a first test signal line and a second test signal line that are disposed in the non-display area,
the crack detecting line is connected with the first data line through a first connection portion and a second connection portion, and the crack detecting line extends along an edge of the display area from the first connection portion to the second connection portion, and
the plurality of data lines are connected to the first test signal line through a first switching element and connected to the second test signal line through a second switching element.

4. The display device of claim 3, wherein the crack detecting line is connected to the first data line through the second switching element, and wherein the crack detecting line is connected to the second test signal line.

5. The display device of claim 4, further comprising:
a first test gate line disposed in the non-display area of the substrate and connected to the first switching element and a second test gate line disposed in the non-display area and connected to the second switching element,
wherein, when a first gate-on voltage is applied to the first test gate line, the plurality of data lines receive a first test signal from the first test signal line, and
when a second gate-on voltage is applied to the second test gate line, the plurality of data lines receive a second test signal from the second test signal line.

6. The display device of claim 5, wherein the second gate-on voltage is applied after the first gate-on voltage is applied, and a first test voltage resulting from the first gate-on voltage is different from a second test voltage resulting from the second gate-on voltage.

7. The display device of claim 1, wherein the plurality of signal lines further comprise a first test signal line and a second test signal line disposed in the non-display area of the substrate,
the crack detecting line and the first data line are connected with each other through a first connection portion and a second connection portion, and the list crack detecting line extends along an edge of the display area from the first connection portion to the second connection portion, and
the plurality of data lines are connected to the first test signal line through a first switching element, and connected to the second test signal line through a second switching element.

8. The display device of claim 7, wherein the crack detecting line is connected to the first data line through the second switching element, and wherein the crack detecting line is connected to the second test signal line.

9. The display device of claim 8, further comprising:
a first test gate line connected to the first switching element and a second test gate line connected to the second switching element, wherein the first and second test gate lines are disposed in the non-display area of the substrate,
wherein, when a first gate-on voltage is applied to the first test gate line, the plurality of data lines receive a first test signal from the first test signal line, and
when a second gate-on voltage is applied to the second test gate line, the plurality of data lines receive a second test signal from the second test signal line.

10. The display device of claim 9, wherein the second gate-on voltage is applied after the first gate-on voltage is applied, a first test voltage resulting from the first gate-on voltage is different from a second test voltage resulting from the second gate-on voltage.

11. A display device comprising:
a substrate including a display area and a non-display area, wherein the non-display area is disposed in an outer periphery of the display area;
a pixel disposed in the display area;
a first data line connected to the pixel; and
a crack detecting line connected to the first data line,
Wherein the crack detecting line comprises an upper portion and a lower portion, the upper portion is disposed above an insulating layer of the substrate and the lower portion is disposed below the insulating layer of the substrate,
and wherein the upper portion is connected to the lower portion through a contact hole that penetrates the insulating layer.

12. The display device of claim 11, wherein the crack detecting line is disposed in the non-display area.

13. The display device of claim 11, wherein the lower portion includes a first contact portion, the upper portion includes a second contact portion, wherein the first and second contact portions are connected with each other through the contact hole.

14. The display device of claim 11, wherein the lower portion is disposed on a first same layer as a gate line, and the upper portion is disposed on a second same layer as the first data line.

15. The display device of claim 11, wherein the lower portion is disposed on a first same layer as a gate electrode of a thin film transistor, and the upper portion is disposed on a second same layer as a drain electrode.

16. The display device of claim 11, further comprising:
a second switching element connected to the first data line and a second test signal line, wherein the crack detecting line is connected to the second switching element and to the second test signal line.

17. The display device of claim 16, further comprising:
a first test signal line connected to the first data line through a first switching element, a first test gate line connected to the first switching element, and a second test gate line connected to the second switching element,
wherein, when a first gate-on voltage is applied to the first test gate line, the first data line receives a first test signal from the first test signal line, and
when a second gate-on voltage is applied to the second test gate line, the first data line receives a second test signal from the second test signal line.

18. The display device of claim 17, wherein, when the second gate-on voltage is applied after the first gate-on voltage is applied, a first test voltage resulting from the first gate-on voltage is different from a second test voltage resulting from the second gate-on voltage.

19. A display device comprising:
a substrate including a display area and a non-display area disposed in an outer periphery of the display area;
a pixel disposed in the display area;
a first data line connected to the pixel; and
a crack detecting line connected to the first data line and disposed in the non-display area,
wherein the crack detecting line comprises a first portion disposed above a first insulating layer and a second insulating layer, and a second portion disposed below the first insulating layer and the second insulating layer, wherein the first and second insulating layers are disposed on the substrate, and the first insulating layer is disposed on the second insulating layer,
and wherein the first portion is connected to the second portion in a hole that penetrates the first insulating layer and the second insulating layer.

20. The display device of claim 19, wherein the second portion is disposed on a first same layer as a gate electrode of a thin film transistor, and the first portion is disposed on a second same layer as a drain electrode.

* * * * *